(12) United States Patent
Pisarenco et al.

(10) Patent No.: US 8,875,078 B2
(45) Date of Patent: Oct. 28, 2014

(54) REFERENCE LIBRARY GENERATION METHOD FOR METHODS OF INSPECTION, INSPECTION APPARATUS AND LITHOGRAPHIC APPARATUS

(75) Inventors: Maxim Pisarenco, Eindhoven (NL); Irwan Dani Setija, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 165 days.

(21) Appl. No.: 13/537,781

(22) Filed: Jun. 29, 2012

(65) Prior Publication Data
US 2013/0035911 A1    Feb. 7, 2013

Related U.S. Application Data

(63) Continuation of application No. 61/514,564, filed on Aug. 3, 2011.

(51) Int. Cl.
*G06F 17/50* (2006.01)
*G03F 7/20* (2006.01)

(52) U.S. Cl.
CPC .................................... *G03F 7/705* (2013.01)
USPC ........................................ 716/113; 716/114

(58) Field of Classification Search
USPC ................................................ 716/110–115
See application file for complete search history.

(56) References Cited

U.S. PATENT DOCUMENTS

| | | | |
|---|---|---|---|
| 2004/0139418 A1* | 7/2004 | Shi et al. | 716/19 |
| 2005/0136340 A1* | 6/2005 | Baselmans et al. | 430/5 |
| 2005/0273753 A1* | 12/2005 | Sezginer | 716/21 |

FOREIGN PATENT DOCUMENTS

EP    1 628 164 A2    2/2006

OTHER PUBLICATIONS

Li, L., "Formulation and comparison of two recursive matrix algorithms for modeling layered diffraction gratings," Journal of the Optical Society of America A, vol. 13, No. 5, May 1996; pp. 1024-1035.

* cited by examiner

*Primary Examiner* — Binh Tat
(74) *Attorney, Agent, or Firm* — Sterne, Kessler, Goldstein & Fox P.L.L.C.

(57) ABSTRACT

A library of model diffraction patterns is generated where each represents a diffraction pattern expected from a target structure defined by a set of parameters and having a first part and a second part, the first part comprising a scattering object. The target structure is defined. The scattering effect of the first part of the target structure is defined by a set of first part parameters, for a plurality of different sets of first part parameters. The scattering effect of the second part of the target structure defined by a set of second part parameters, for a plurality of different sets of second part parameters. The results of the calculations is used to calculate the model diffraction patterns.

15 Claims, 7 Drawing Sheets

REFERENCE LIBRARY GENERATION METHOD FOR METHODS OF INSPECTION, INSPECTION APPARATUS AND LITHOGRAPHIC APPARATUS

CROSS REFERENCE TO RELATED APPLICATIONS

This application claims the benefit under 35 U.S.C. §119(e) to U.S. Provisional Patent Application No. 61/514,564, filed Aug. 3, 2011, which is incorporated by reference herein in its entirety.

FIELD

The present invention relates to methods of inspection usable, for example, in the manufacture of devices by lithographic techniques. In particular it relates to methods of generating a library of model diffraction patterns for use in the methods of inspection.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Current library-based reconstruction of metrology target profiles is based on comparing measured and computed angular-resolved spectra. The computed spectra are stored in a library for a range of varying parameters: e.g., CD (critical dimension), SWA (side wall angle), height, stack parameters. More or other parameters may be required depending on the actual profile, or if the profile is structured in 2 dimensions. In this way, during reconstruction there is no need to compute any solutions to the rigorous diffraction model. Typically, the library is generated before the actual profile reconstruction. This takes a substantial amount of time depending on the number of floating parameters and the density of the grid with which each parameter is sampled.

Therefore, to generate the library may take an unacceptably long time, particularly for reconstruction of 2D periodic structures.

SUMMARY

It is desirable to provide a system that can shorten the time required to generate a library of computed spectra such as described above.

According to an aspect of the present invention, there is provided a method of generating a library of model diffraction patterns, each representing the diffraction pattern expected from a target structure defined by a set of parameters and having a first part and a second part, the first part comprising a scattering object, the method for use in an inspection process and comprising: defining the target structure, calculating the scattering effect of the first part of the target structure defined by a set of first part parameters, for a plurality of different sets of first part parameters, calculating the scattering effect of the second part of the target structure defined by a set of second part parameters, for a plurality of different sets of second part parameters, and combining the results of the calculations performed at steps b) and c) to calculate the model diffraction patterns.

According to a second aspect of the present invention, there is provided an inspection method comprising, performing the library generation method of the first aspect, so as to generate a library of model diffraction patterns, directing a beam of radiation onto a real target structure, having a first part and a second part, the first part comprising a scattering object, observing a diffraction pattern of the scattered radiation, and comparing the diffraction pattern of the scattered radiation to the model diffraction patterns so as to find the closest match, thereby determining one or more properties of the real target structure.

According to other aspects of the present invention, there is provided an inspection apparatus a lithographic apparatus and a computer program product operable to perform the methods of the first and second aspects of the invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
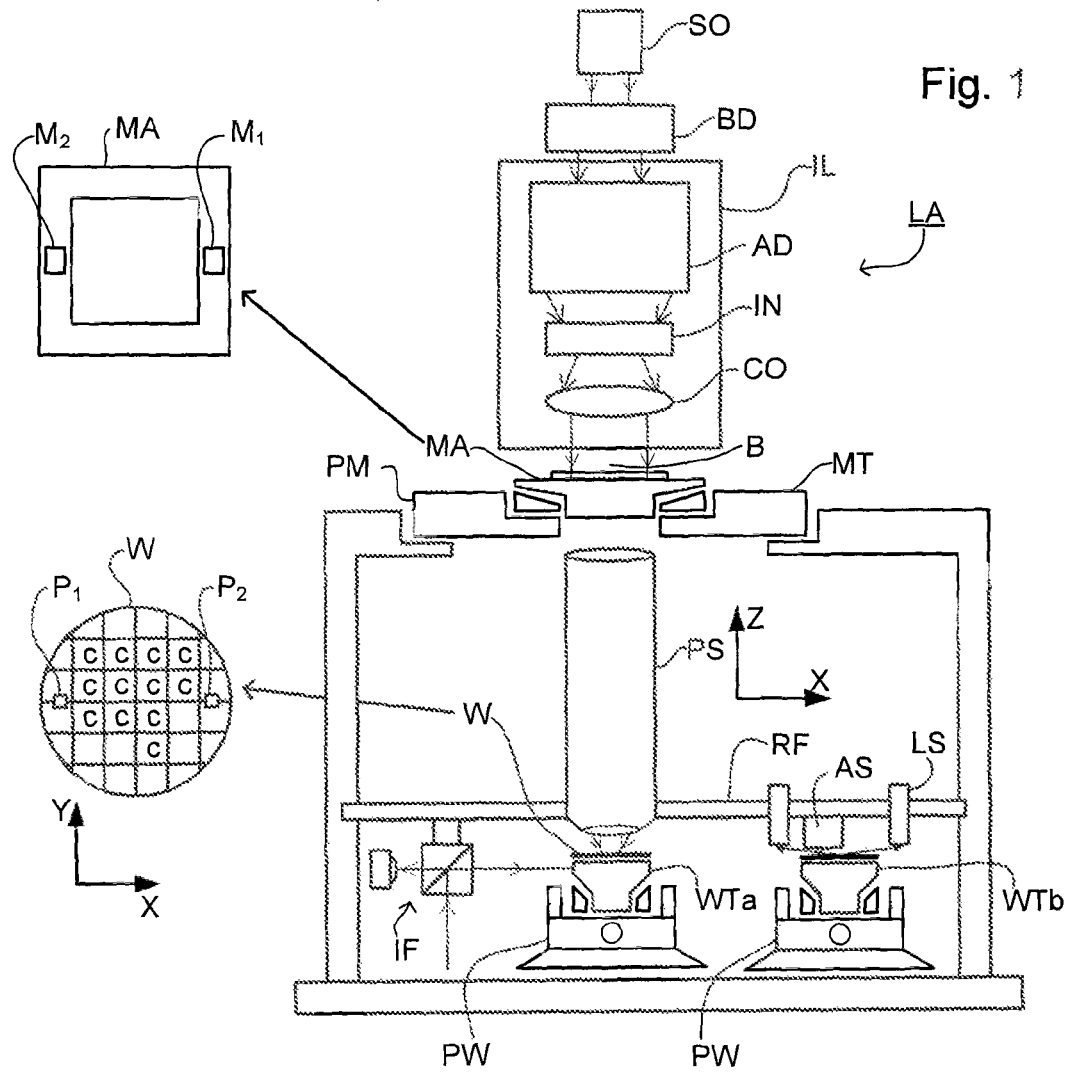
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
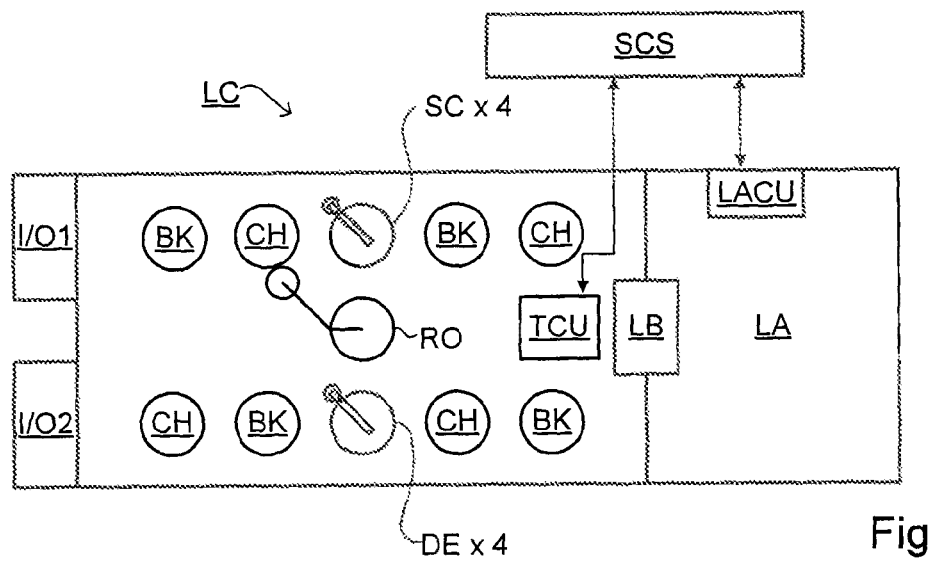
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
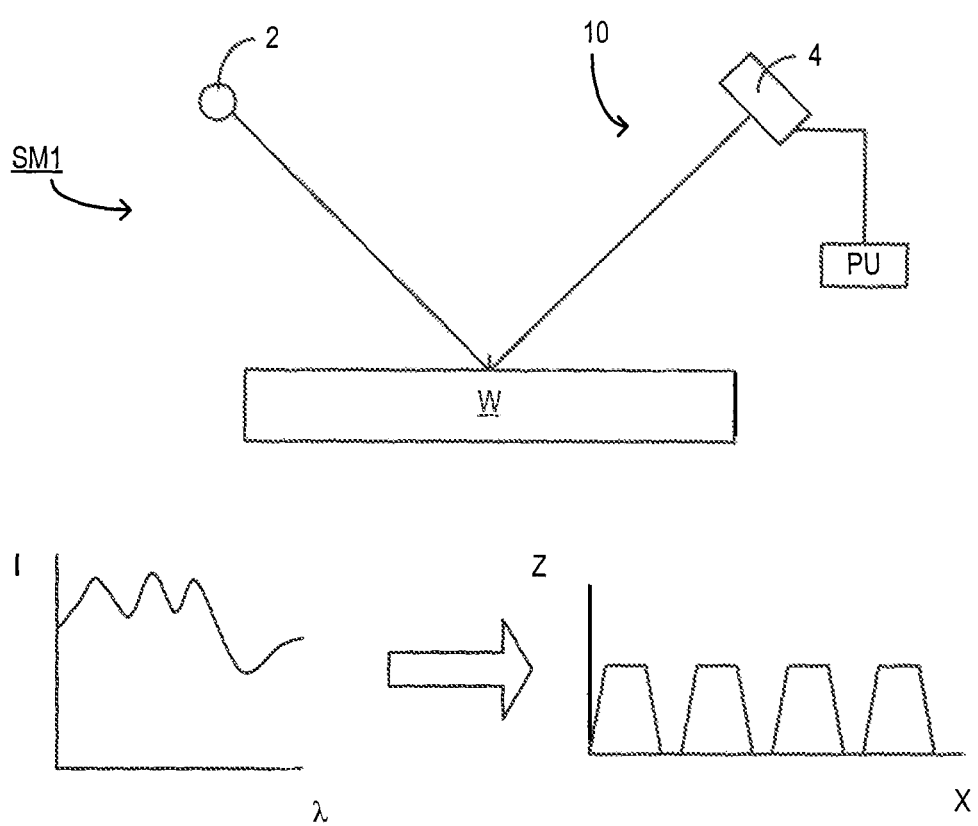
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
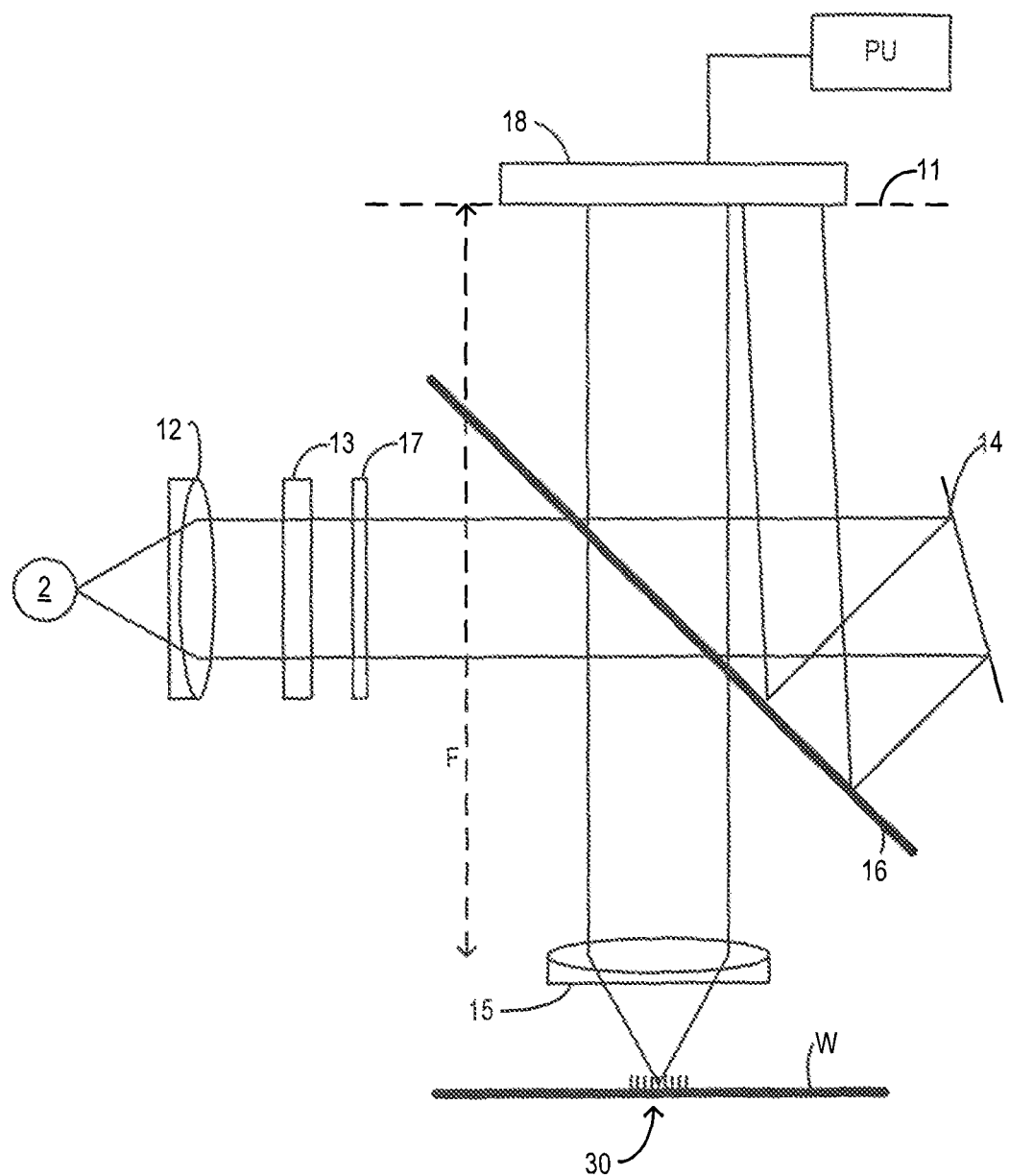
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

The target will often take the shape of a series of lines in a grating or substantially rectangular structures in a 2-D array on the surface of a substrate. The purpose of rigorous optical diffraction theories in metrology is effectively the calculation of a diffraction spectrum that is reflected from the target. In other words, target shape information is obtained for CD uniformity and overlay metrology. Overlay metrology is a measuring system in which the overlay of two targets is measured in order to determine whether two layers on a substrate are aligned or not. CD uniformity is a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
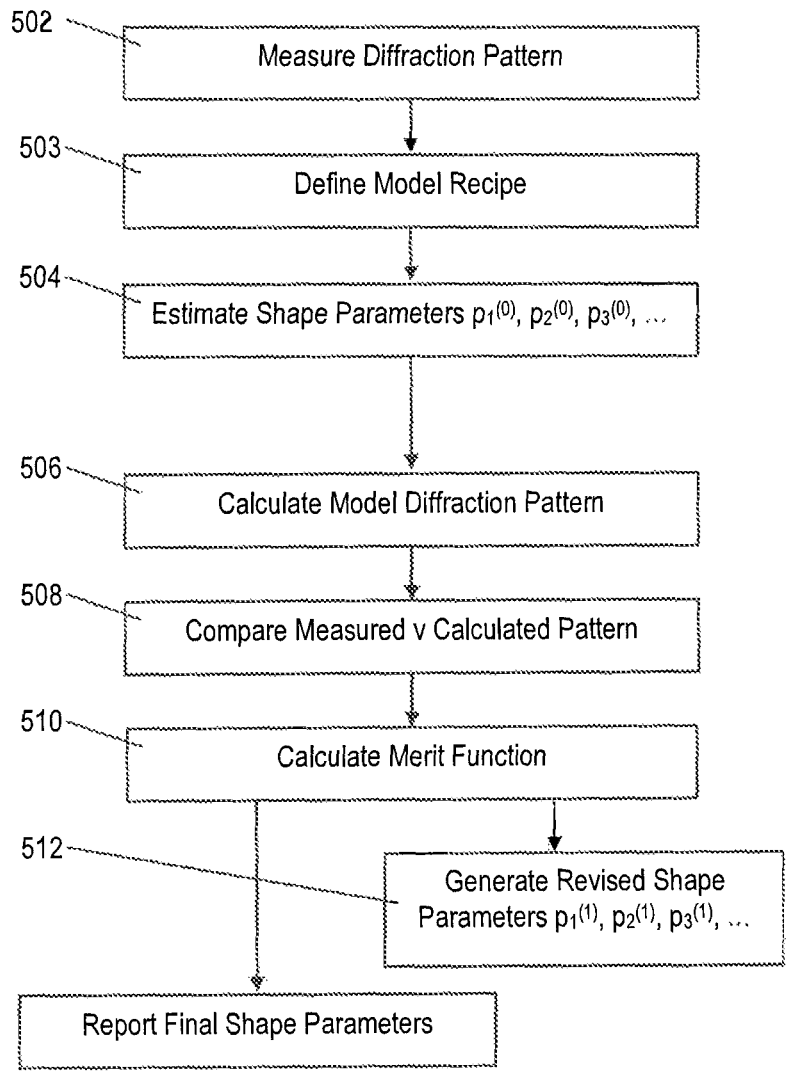
FIG. 5 depicts a first example process for reconstruction of a structure from scatterometer measurements.

Referring to FIG. 5 in more detail, the way the measurement of the target shape and/or material properties is carried out will be described in summary. The target will be assumed for this description to be periodic in only 1 direction (1D-periodic). In practice it may be periodic in 2 directions (2D-periodic structure), and the processing will be adapted accordingly.

In step 502: The diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503: A 'model recipe' is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, ways will be introduced in which parameters can be permitted to vary without being fully independent floating parameters. For the purposes of describing FIG. 5, only the variable parameters are considered as parameters pi.

In step 504: A model target shape is estimated by setting initial values pi(0) for the floating parameters (i.e., p1(0), p2(0), p3(0) and so on). Each floating parameter will be generated within certain predetermined ranges, as defined in the recipe.

In step 506: The parameters representing the estimated shape, together with the optical properties of the different elements of the model, are used to calculate the scattering properties, for example using a rigorous optical diffraction method such as rigorous coupled-wave analysis (RCWA) or any other solver of Maxwell equations. This gives an estimated or model diffraction pattern of the estimated target shape.

In step 508, 510: The measured diffraction pattern and the model diffraction pattern are then compared and their similarities and differences are used to calculate a "merit function" for the model target shape.

In step 512: Assuming that the merit function indicates that the model needs to be improved before it represents accurately the actual target shape, new parameters p1(1), p2(1), p3(1), etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514: When the merit function indicates that this iterative process has converged on a solution with a desired accuracy, the currently estimated parameters are reported as the measurement of the actual target structure.

The computation time of this iterative process is largely determined by the forward diffraction model used, i.e., the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502 For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
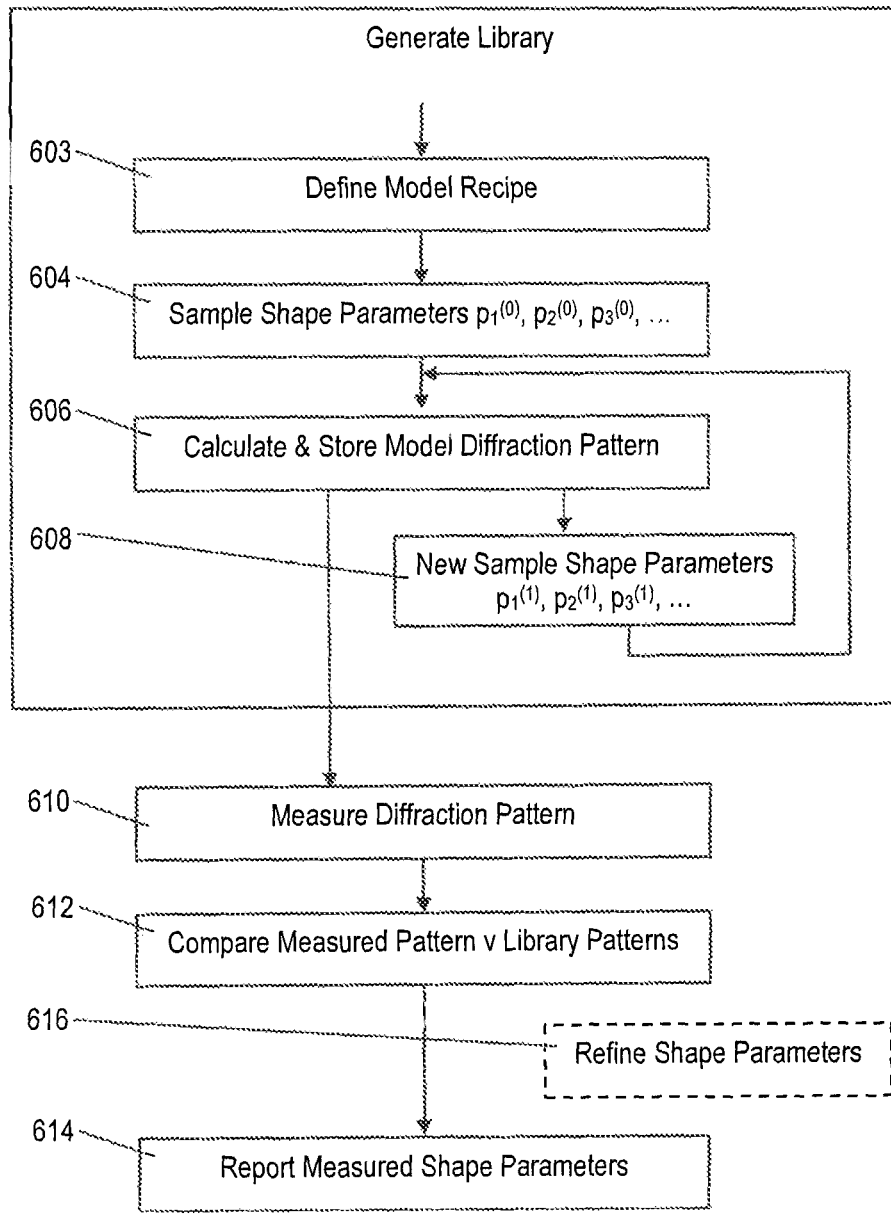
FIG. 6 depicts a second example process for reconstruction of a structure from scatterometer measurements.

Reconstruction techniques such as those described above may often be too slow to be performed in real-time. To address this, FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602: The process of generating the library begins. A separate library may be generated for each type of target structure. The library may be generated by a user of the measurement apparatus according to need, or may be pre-generated by a supplier of the apparatus.

In step 603: A 'model recipe' is established which defines a parameterized model of the target structure in terms of a number of parameters $p_i$ ($p_1$, $p_2$, $p_3$ and so on). Considerations are similar to those in step 503 of the iterative process.

In step 604: A first set of parameters $p_1^{(0)}$, $p_2^{(0)}$, $p_3^{(0)}$, etc. is generated, for example by generating random values of all the parameters, each within its expected range of values.

In step 606: A model diffraction pattern is calculated and stored in a library, representing the diffraction pattern expected from a target shape represented by the parameters.

In step 608: A new set of shape parameters $p_1^{(1)}$, $p_2^{(1)}$, $p_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610: After the library is generated (though it could be before), the real target 30 is placed in the scatterometer and its diffraction pattern is measured.

In step 612: The measured pattern is compared with the modeled patterns stored in the library to find the best matching pattern. The comparison may be made with every sample in the library, or a more systematic searching strategy may be employed, to reduce computational burden.

In step 614: If a match is found then the estimated target shape used to generate the matching library pattern can be determined to be the approximate object structure. The shape parameters corresponding to the matching sample are output as the measured shape parameters. The matching process may be performed directly on the model diffraction signals, or it may be performed on substitute models which are optimized for fast evaluation.

In step 616: Optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might be too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e., the calculation of the estimated model diffraction pattern using a rigorous optical diffraction theory from the estimated target shape.

Generation of the library can take an unacceptably long time depending on the number of floating parameters. The number of sampling points in parameter space grows exponentially with the number of floating parameters, a problem often referred to as the curse of dimensionality. Even for a simple 1D-periodic trapezoid on top of a multilayer stack, the trapezoid having only 3 floating profile parameters (CD, SWA and height), the number of floating parameters can rapidly increase if for a few layers, both (n,k) and thickness are unknown. This is especially the case for 2D-periodic COMPASS reconstruction, or if one of these layers is birefringent. Hence, while the proposals described herein are applicable to 1D reconstruction (e.g., RCWA), they are particularly beneficial for 2D reconstruction.

Figure 7:
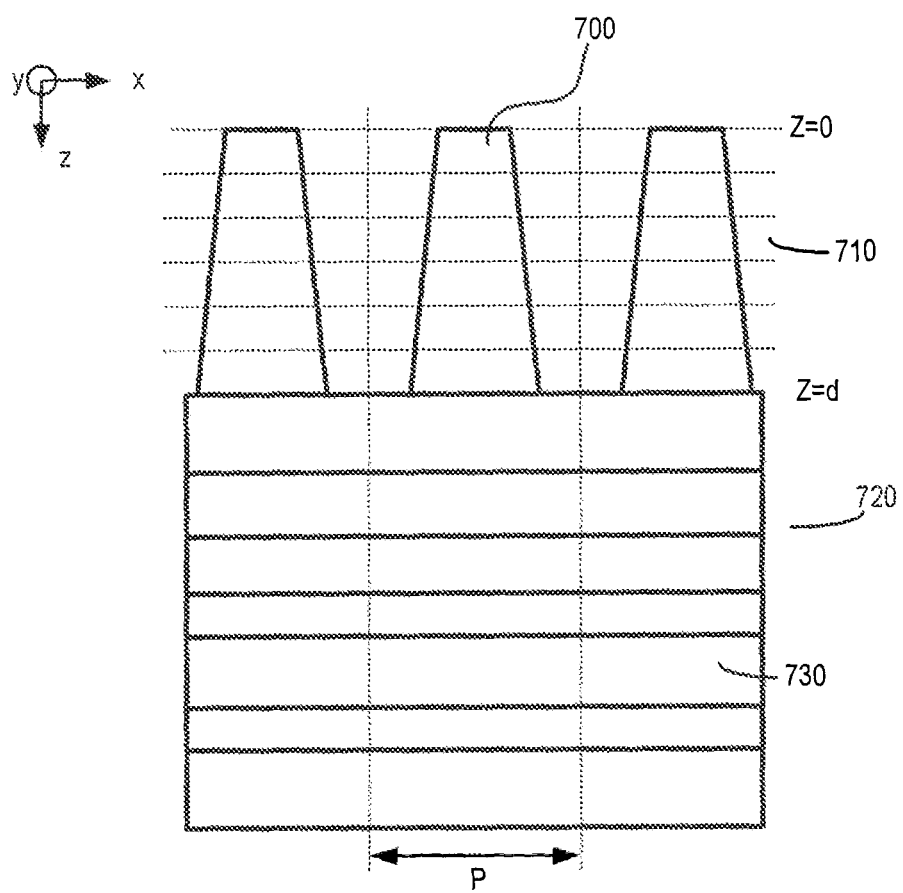
FIG. 7 shows a typical structure which may be the subject of the example processes of FIGS. 5 and/or 6.

Currently, a library is generated for a structure consisting of an (unknown) scattering object (for example, a grating) on top of a multilayer stack having unknown stack parameters. FIG. 7 shows such a structure. Shown are three grating elements 700, which form part of a larger grating structure having pitch P. These grating elements 700 are treated as a plurality (six in this case) of layers 710 during reconstruction. Below this is the multilayer stack 720, comprising layers 730.

While Multilayer stacks can have a large number of floating parameters, the diffraction problem for a multilayer stack is extremely simple and can be solved analytically. Conversely, the grating may only have 3 or 4 floating parameters, but is far more numerically challenging to solve. Using present techniques, the complete diffraction problem for the grating and multilayer is solved for any change in a floating parameter, even when it is only a parameter in the multilayer that changes.

The inventors have appreciated that the scattering problem can be separated into a grating part and a multilayer part. The grating library now only needs to be sampled over $\sim s^p$ points where s is the number of sample points per floating grating parameter and p is the number of floating grating parameters. The multilayer library needs to be sampled over $\sim s^q$ points where q is the number of floating parameters in the multilayer. In practice however, the solution for a particular multilayer configuration can be calculated so quickly that it can be done instantly, and not by way of a library. Finally, the grating scattering matrix $S_{grating}$, and the multilayer scattering matrix, $S_{multi}$, are combined to give the total solution. This has to be done for $\sim s^{p+q}$ combinations, the same number of sampling points that is computed in the library generation according to current techniques. However, the combination of $S_{grating}$ and $S_{multi}$ is faster and more efficient than a complete forward solve.

The proposed methodology will now be explained in greater detail. For RCWA, in order to solve (in a stable manner) the recursive linear system which results from the application of matching conditions at interfaces, stable recursion algorithms are applied. A few variations of these algorithms are known, such as the Enhanced Transmittance Matrix Approach (ETMA), the R-matrix and the S-matrix algorithms. It is proposed to exploit the associativity property of the Redheffer star product used in the S-matrix algorithm in order to reuse the information related to the grating stack 700 (the stack of slices 710 with changing linewidth), which is the most expensive part of the computations.

In the current implementation of RCWA, the whole algorithm is performed for every sample point in parameter space, i.e., for every profile configuration of the grating and every thickness and (n,k)-combination of the multilayer. With the description in S-matrices, it is possible to separate the computation into a grating part and a multilayer part. In this way a higher efficiency in terms of computational costs can be achieved. In particular, this approach is applied for the parameter sweep when the changing parameters are associated with homogeneous layers in the multilayer stack.

Application of the Maxwell interface conditions in RCWA typically yields a relation of the form:

$$\begin{bmatrix} W_l X_l & W_l \\ V_l X_l & -V_l \end{bmatrix} \begin{bmatrix} c_l^+ \\ c_l^- \end{bmatrix} = \begin{bmatrix} W_{l+1} & W_{l+1} X_{l+1} \\ V_{l+1} & -V_{l+1} X_{l+1} \end{bmatrix} \begin{bmatrix} c_{l+1}^+ \\ c_{l+1}^- \end{bmatrix} \quad \text{Equation 1}$$

$$(l = 1, \ldots M)$$

where $W_l$ resp. $W_{l+1}$ is the matrix of eigenvectors in layer l resp. (l+1), $V_l = W_l Q_l$ where $Q_l$ is the diagonal matrix of eigenvalues and $X_l = \exp(-k_0 q_{l,n})$ is the matrix of phase offsets over the layer thickness for each eigenmode; $c_1^+$ is the (2N+1)-vector of coefficients of the modes travelling in the positive z-direction and $c_1^-$ is the (2N+1)-vector of modes travelling in the negative z-direction. The radiation conditions imply that $c_1^+ = d_0$ and $c_{M+1}^- = 0$.

Equation 1 can be rewritten to $$\begin{bmatrix} W_l & W_l \\ V_l & -V_l \end{bmatrix} \begin{bmatrix} X_l c_l^+ \\ c_l^- \end{bmatrix} = \begin{bmatrix} W_{l+1} & W_{l+1} \\ V_{l+1} & -V_{l+1} \end{bmatrix} \begin{bmatrix} c_{l+1}^+ \\ X_{l+1} c_{l+1}^- \end{bmatrix} \quad \text{Equation 2}$$

$$\Leftrightarrow \begin{bmatrix} c_{l+1}^+ \\ X_{l+1} c_{l+1}^- \end{bmatrix} = \frac{1}{2} \begin{bmatrix} W_{l+1}^{-1} & V_{l+1}^{-1} \\ W_{l+1}^{-1} & -V_{l+1}^{-1} \end{bmatrix} \begin{bmatrix} W_l & W_l \\ V_l & -V_l \end{bmatrix} \begin{bmatrix} X_l c_l^+ \\ c_l^- \end{bmatrix}$$

$$= \begin{bmatrix} T_{l,l+1}^{11} & T_{l,l+1}^{12} \\ T_{l,l+1}^{21} & T_{l,l+1}^{22} \end{bmatrix} \begin{bmatrix} X_l c_l^+ \\ c_l^- \end{bmatrix}$$

The above relation can be manipulated into an S-matrix form, which guarantees stable numerical computations:

$$\begin{bmatrix} c_{l+1}^+ \\ c_l^- \end{bmatrix} = \begin{bmatrix} S_{l,l+1}^{11} & S_{l,l+1}^{12} \\ S_{l,l+1}^{21} & S_{l,l+1}^{22} \end{bmatrix} \begin{bmatrix} c_l^+ \\ c_{l+1}^- \end{bmatrix} \quad \text{Equation 3}$$

where $$S_{l,l+1}^{11} = (T_{l,l+1}^{11} - T_{l,l+1}^{12}(T_{l,l+1}^{22})^{-1} T_{l,l+1}^{21}) X_l \quad \text{Equation 4}$$

$$S_{l,l+1}^{12} = T_{l,l+1}^{12}(T_{l,l+1}^{22})^{-1} X_{l+1}$$

$$S_{l,l+1}^{21} = -(T_{l,l+1}^{22})^{-1} T_{l,l+1}^{21} X_l$$

$$S_{l,l+1}^{22} = (T_{l,l+1}^{22})^{-1} X_{l+1}$$

This matrix expresses the waves moving away from the interface in terms of the waves incident on the interface. The matrix $S_{l,l+1}$ fully describes the scattering properties of the interface l (situated between layers l and l+1). Note that the blocks $S^{11}_{l,l+1}$, $S^{12}_{l,l+1}$, $S^{21}_{l,l+1}$ and $S^{22}_{l,l+1}$ are diagonal for homogeneous layers.

Figure 8:
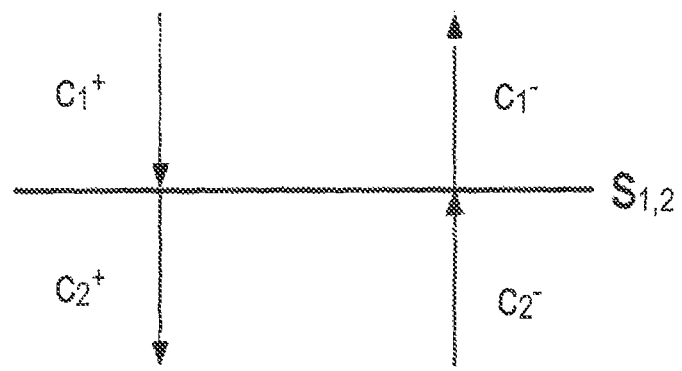
FIG. 8 shows one interface described by the scattering matrix $S_{1,2}$.
Figure 9:
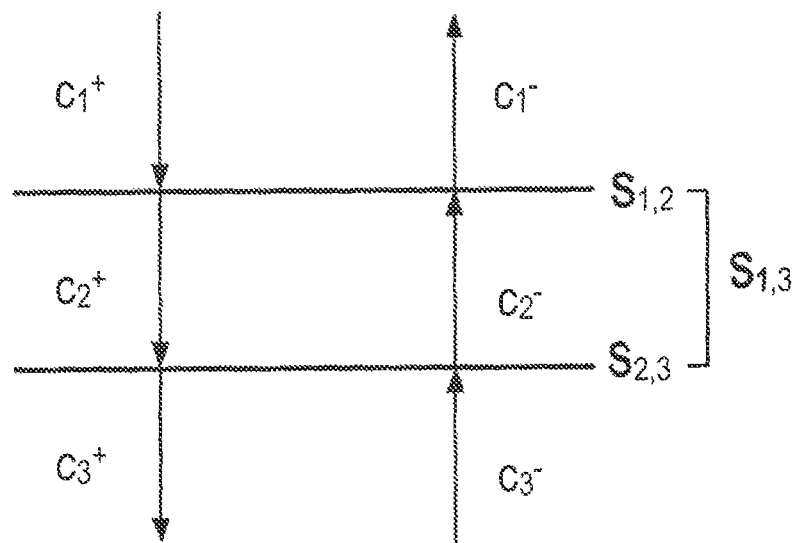
FIG. 9 illustrates how two adjacent interfaces described by the scattering matrices $S_{1,2}$ and $S_{2,3}$ can be merged into one equivalent interface described by a scattering matrix $S_{1,3}$.

FIG. 8 shows one interface described by the scattering matrix $S_{1,2}$. Now, consider two adjacent interfaces described by the scattering matrices $S_{1,2}$ and $S_{2,3}$. The two interfaces can be merged into one equivalent interface described by a scattering matrix $S_{1,3}$. This is illustrated in FIG. 9.

For easy reference to the merging operation the Redheffer star product is defined:

$$S_{1,2} * S_{2,3} \equiv S_{1,3} \quad \text{Equation 5}$$

where $$S_{1,3} = \begin{pmatrix} S_{2,3}^{11}(I - S_{1,2}^{12} S_{2,3}^{21})^{-1} S_{1,2}^{11} & S_{2,3}^{12} + S_{2,3}^{11} S_{1,2}^{12}(I - S_{2,3}^{21} S_{1,2}^{12})^{-1} S_{2,3}^{22} \\ S_{1,2}^{21} + S_{1,2}^{22} S_{2,3}^{21}(I - S_{1,2}^{12} S_{2,3}^{21})^{-1} S_{1,2}^{11} & S_{1,2}^{22}(I - S_{2,3}^{21} S_{1,2}^{12})^{-1} S_{2,3}^{22} \end{pmatrix} \quad \text{Equation 6}$$

It should be noted that for two homogeneous layer interfaces, all matrices $S^{ij}$ are diagonal. Therefore, the inverses can be computed analytically and all matrix-matrix products scale with O(N).

With this notation, the S-matrix algorithm is given by the update relation:

$$S_{1,l+1} = S_{1,l} * S_{l,l+1} \quad \text{Equation 7}$$

The S matrix for the whole stack of (M−1) interfaces (M layers) is given by:

$$S_{1,M} = \lfloor \lfloor S_{1,2} * S_{2,3} \rfloor * S_{3,4} \rfloor * \ldots * S_{M-1,M} \rfloor \quad \text{Equation 8}$$

Once the matrix for the whole stack is computed, the coefficients in the upper and lower layers are given by $$\begin{bmatrix} c_M^+ \\ c_1^- \end{bmatrix} = \begin{bmatrix} S_{1,M}^{11} & S_{1,M}^{12} \\ S_{1,M}^{21} & S_{1,M}^{22} \end{bmatrix} \begin{bmatrix} c_1^+ \\ c_M^- \end{bmatrix} = \begin{bmatrix} S_{1,M}^{11} & S_{1,M}^{12} \\ S_{1,M}^{21} & S_{1,M}^{22} \end{bmatrix} \begin{bmatrix} d_0 \\ 0 \end{bmatrix} \quad \text{Equation 9}$$

It can be shown that the Redheffer star product is associative. Thus, the multiplication operations can be regrouped. Supposing the parameters describing layer j are varied. Equation 8 may then be rewritten:

$$S_{1,M} = \lfloor S_{1,2} * \ldots * S_{j-2,j-1} \rfloor * S_{j-1,j} * S_{j,j+1} * \quad \text{Equation 10}$$

$$\lfloor S_{j+1,j+2} * \ldots * S_{M-1,M} \rfloor$$

$$= S_{1,j-1} * S_{j-1,j} * S_{j,j+1} * S_{j+1,M}$$

The matrices $S_{1,j-1}$, $S_{j+1,M-1}$ need only be computed once for a fixed set of grating parameters. The variations of parameters of the homogeneous layer j only changes the matrices $S_{j-1,j}$ and $S_{j,j+1}$. It is this associative property of the Redheffer star product which can be exploited in the efficient generation of a library for CD-reconstruction. As a consequence of this, in the S-matrix formulation, it is possible to separate the forward computation into three phases:

The generation of grating S-matrices
The generation of homogeneous multilayer S-matrices
Redheffer product of multilayer S-matrix with grating S-matrix As previously explained, phase 1 is the most computationally intensive part and the results should therefore be most efficiently used. Therefore all S-matrices corresponding to the sampling points in the grating parameter space are computed and temporarily stored.

As phase 2 is much less intensive, the multilayer S-matrices are not stored but immediately Redheffer-multiplied with every grating S-matrix in the library. This can be performed efficiently by using Equation 6 and Equation 9. From Equation 9, it can be seen that only the first column of the total S-matrix needs to be evaluated. From Equation 6, it can be seen how to compute the first column in terms of the grating S-matrix ($\sim S_{1,2}$) and the multilayer S-matrix ($\sim S_{2,3}$). Since the vector $d_0$ is a vector of zeros with only one element equal to "1", the multiplication with $S_{1,2}^{11}$ selects one column of this matrix. For the multiplication with the inverse it is not necessary to first compute the inverse, which is an expensive operation, but instead it is more efficient to compute the solution to:

$$(1-S_{1,2}^{12}S_{2,3}^{21})x = S_{1,2}^{11}d_0 \qquad \text{Equation 11}$$

Consequently, in one embodiment, phase 1 is performed first, with phase 2 and phase 3 being performed together.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

The invention claimed is:

1. A method of generating a library of model diffraction patterns, each representing a diffraction pattern expected from a target structure defined by a set of parameters and having a first part and a second part, the first part comprising a scattering object, the method comprising:
   calculating, using a processing unit, a first scattering effect of the first part of the target structure defined by a set of first part parameters for a plurality of different sets of first part parameters;
   calculating, using the processing unit, a second scattering effect of the second part of the target structure defined by a set of second part parameters for a plurality of different sets of second part parameters; and
   combining, using a processing unit, results of the calculatings to calculate model diffraction patterns, wherein the results of the calculating a first scattering effect are stored as they are calculated, these stored results being subsequently combined with the results of the calculating a second scattering effect as the latter are calculated.

2. The method of claim 1, wherein the calculating of the first scattering effect is relatively more computationally intensive than the calculating of the second scattering effect.

3. The method of claim 1, wherein the second part of the target structure comprises a plurality of substantially parallel layers.

4. The method of claim 1, wherein the combining is performed for every possible permutation of the calculating of the first scattering effect and the calculating of the second scattering effect.

5. The method of claim 1, wherein the calculatings further comprise generating first and second scattering matrices to respectively describe the first and second scattering effects.

6. The method of claim 5, wherein the combining comprises calculating a Redheffer star product for each combination of the first and second scattering matrices.

7. The method of claim 1, wherein the scattering object comprises a grating.

8. An inspection process comprising,
generating a library of model diffraction patterns, comprising:
calculating a first scattering effect of a first part of a target structure defined by a set of first part parameters for a plurality of different sets of first part parameters;
calculating a second scattering effect of a second part of the target structure defined by a set of second part parameters for a plurality of different sets of second part parameters; and
combining results of the calculatings to calculate model diffraction patterns, wherein the results of the calculating a first scattering effect are stored as they are calculated, these stored results being subsequently combined with the results of the calculating a second scattering effect as the latter are calculated;
directing a beam of radiation onto a real target structure, having a first part and a second part, the first part comprising a scattering object;
observing a diffraction pattern of the scattered radiation; and
comparing the diffraction pattern of the scattered radiation to the model diffraction patterns so as to find the closest match, thereby determining one or more properties of the real target structure.

9. A method of generating a library of model diffraction patterns, each representing a diffraction pattern expected from a target structure defined by a set of parameters and having a first part and a second part, the first part comprising a scattering object, the method for use in an inspection process and comprising:
a first calculating of, using a processing unit, a scattering effect of the first part of the target structure defined by a set of first part parameters, for a plurality of different sets of first part parameters;
a second calculating of, using the processing unit, a scattering effect of the second part of the target structure defined by a set of second part parameters, for a plurality of different sets of second part parameters; and
combining, using the processing unit, results of the first and second calculatings to calculate model diffraction patterns, wherein the results of the first calculating are stored as they are calculated, these stored results being subsequently combined with the results of the second calculating as the latter are calculated.

10. The method of claim 9, wherein the target structure is such that the first calculating is relatively more computationally intensive than the second calculating.

11. The method of claim 9, wherein the second part of the target structure comprises a plurality of substantially parallel layers.

12. The method of claim 9, wherein the combining is performed for every possible permutation of the calculations performed at the first calculating with the calculations performed at the second calculating.

13. The method of claim 9, wherein the first and second calculatings comprise generating scattering matrices to describe the scattering effects of the first part of the target structure and the second part of the target structure respectively.

14. An inspection apparatus operable to perform the method of:
a first calculating of a scattering effect of a first part of a target structure defined by a set of first part parameters, for a plurality of different sets of first part parameters;
a second calculating of a scattering effect of a second part of the target structure defined by a set of second part parameters, for a plurality of different sets of second part parameters; and
combining results of the first and second calculatings to calculate model diffraction patterns, wherein the results of the first calculating are stored as they are calculated, these stored results being subsequently combined with the results of the second calculating as the latter are calculated.

15. A computer program product comprising program instructions operable to cause a processor to perform the operations of:
a first calculating of a scattering effect of a first part of a target structure defined by a set of first part parameters, for a plurality of different sets of first part parameters;
a second calculating of a scattering effect of a second part of the target structure defined by a set of second part parameters, for a plurality of different sets of second part parameters; and
combining results of the first and second calculatings to calculate model diffraction patterns, wherein the results of the first calculating are stored as they are calculated, these stored results being subsequently combined with the results of the second calculating as the latter are calculated.

* * * * *